United States Patent [19]

Seligsohn et al.

[11] 4,439,638

[45] Mar. 27, 1984

[54] SOUND-ACTIVATED CODE-CONTROLLED DETECTION SYSTEM FOR TELEPHONES AND THE LIKE

[75] Inventors: Scott Seligsohn, Penn Valley; Duane R. Bolgiano, Bala Cynwyd; Sherwin I. Seligsohn, Penn Valley, all of Pa.

[73] Assignee: International Mobile Machines Corp., Philadelphia, Pa.

[21] Appl. No.: 343,445

[22] Filed: Jan. 28, 1982

[51] Int. Cl.$^3$ ............................................. H04M 1/26
[52] U.S. Cl. ................................ 179/84 C; 179/84 SS
[58] Field of Search ............... 179/84 C, 1 VC, 1 SD, 179/84 SS

[56] References Cited

U.S. PATENT DOCUMENTS 4,266,098  5/1981  Novak .............................. 179/84 C Primary Examiner—A. D. Pellinen
Assistant Examiner—James L. Dwyer
Attorney, Agent, or Firm—Arthur A. Jacobs

[57] ABSTRACT

A function generating system such as a telephone ringer, which is sound or voice-controlled in that when the signal is first applied by the caller it results in a series of digits or other sounds emitted by the receiver. The caller follows each of these sounds by either a responsive sound or silence. When the responsive sounds correspond to a programmed code, the function is activated.

10 Claims, 4 Drawing Figures

SOUND-ACTIVATED CODE-CONTROLLED DETECTION SYSTEM FOR TELEPHONES AND THE LIKE

The present invention relates to a sound-actuated control system, and it particularly relates to a system of this type which can be both programmed and actuated by voice signals.

As a specific embodiment of the invention, it is illustrated as applied to the generation of a ringing signal in a telephone system, but it is to be understood that the system may be used for the activation of any desired function which is electrically controlled by the use of a programmed code.

When the system is connected to a telephone line, a telephone instrument is connected thereto. By moving a switch, the system can be put into an ENTER mode where a number can be programmed into a memory. Then by putting the switch into an ON mode, any telephone call which comes in will not cause a ringing signal in the telephone or extension telephone but will instead start the voice activation system. If, by means of the voice activation system, the same digits previously entered are again entered, then an enunciation or ringing signal will be produced by the system. The numbers are entered by a voice or manual method whereby, instead of a ringing signal, the caller would hear a repetition of numerals such as "One, Two, Three, Four, etc." Any sound which is made following any of these digits would cause that particular digital value to be entered. As previously noted, if the digits so entered match digits previously so entered during the ENTER mode, then an enunciating or ringing signal is produced. A disconnect switch is also provided for turning the device on and off. When in the OFF mode, the telephone will ring normally. The two switches can be combined into a single three-position switch.

The primary object of the present invention is, therefore, to provide a simple, voice-actuated control system for electrically-operated function-generating means.

Another object of the present invention is the application of the aforesaid system in a telephone system.

Other objects and many of the attendant advantages of the present invention will be readily appreciated as the same becomes better understood by reference to the following description when read in conjunction with the accompanying drawings wherein.

Figure 1:
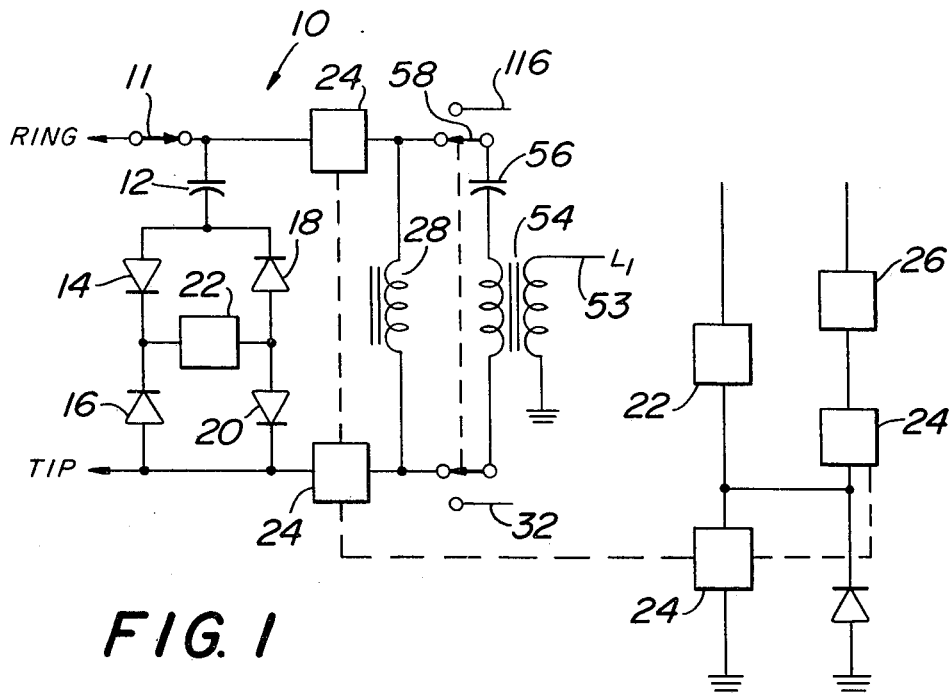
FIG. 1 is a schematic view of the entry circuit.

Referring now in greater detail to the figures of the drawings wherein similar reference characters refer to similar parts, there is shown in FIG. 1 a system, generally designated 10, which includes two terminals indicated at "Tip" and "Ring" respectively. A switch 11 is provided for connecting or disconnecting the system from the telephone.

When the switch 11 connects the system, if a ringing signal appears between "Tip" and "Ring", it is AC-coupled through a capacitor 12 and rectified by the bridge-rectifiers 14, 16, 18 and 20 to operate delay 22. The contacts of relay 22 operate relay 24.

The contacts of relay 24 do several things: (1) they electrically latch relay 24 so that it continues to operate until such time as relay 26 operates; (2) they connect the inductor of transformer 28 between the "Tip" and the "Ring", causing an on-hook condition, and, when in such on-hook position, the telephone does not ring; (3) they operate relay 26 so that the telephone instrument itself, instead of being connected between "Tip" and "Ring", is connected to a power supply through resistor 30 (shown in FIG. 4) such that line 32 (in FIG. 4) is ground potential unless the instrument goes off-hook, at which time line 32 becomes positive; (4) are connected to resistor 34 (shown in FIG. 2) so as to make one of the inputs of gate 36 (shown in FIG. 2) positive (or a logical 1).

Figure 2:
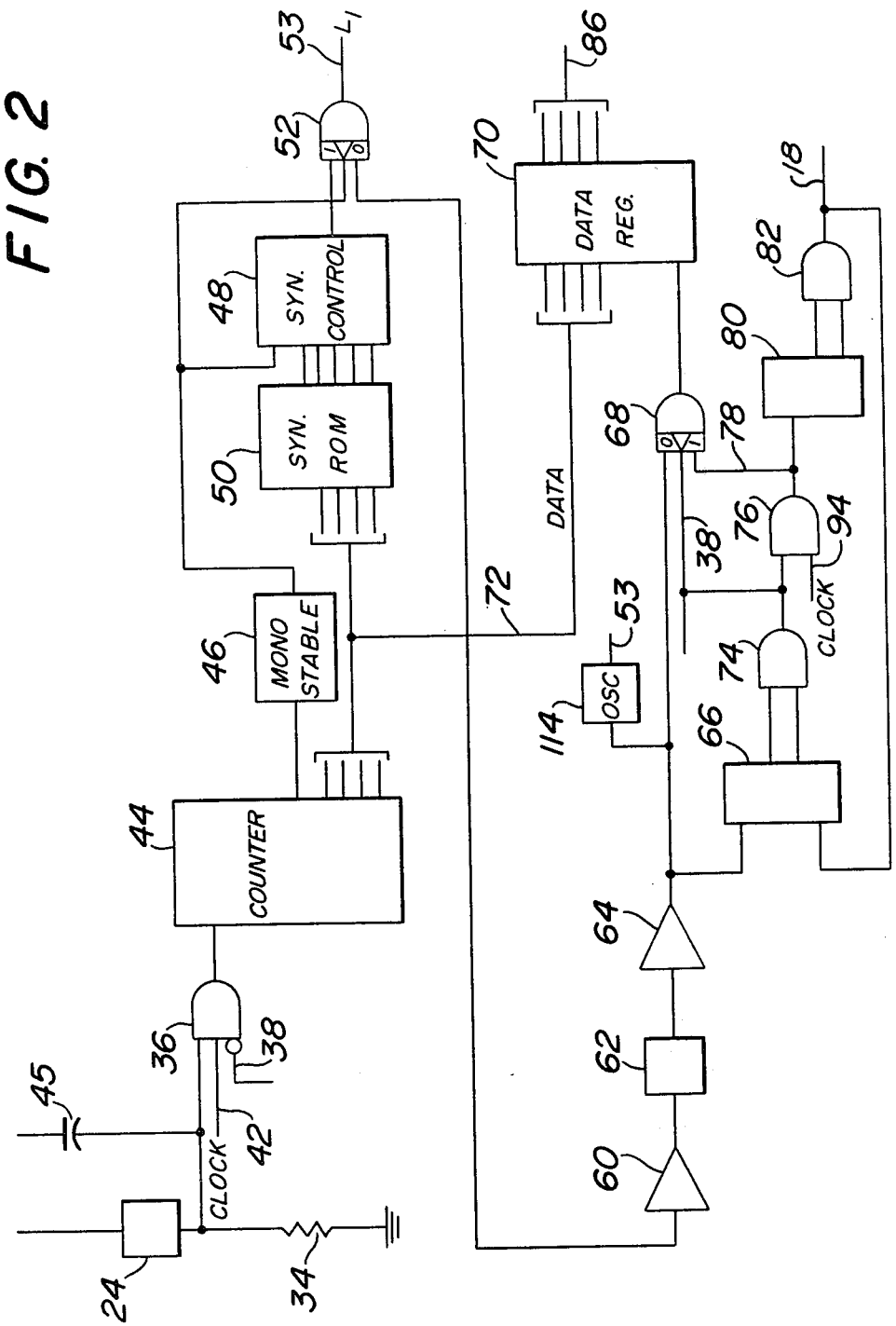
FIG. 2 is a schematic view of the logic containing the voice synthesizer circuit.

Line 38 is a logical 0 so that clock pulses from a generator thereof can be passed to gate 36 by means of line 42, and thence to counter 44. A capacitor 45 is connected between relay 24 and gate 36. If the clock rate is appropriate, such as between 1 and 2 seconds between clock pulses, then the line from counter 44 to a monostable 46 can be connected such that it is connected to a 2-to-the-1-output of the counter 44. If the clock rate is faster, then, as indicated in FIG. 2, the division ratio of counter 44 is made larger which causes pulses to appear at the input to the monostable 46 at an appropriate rate, as, for example, once per one or two seconds. Monostable 46 produces a pulse which is shorter than the time between the pulses from counter 44 to monostable 46.

The output of monostable 46 operates a synthesizer control 48 which, on the basis of the programmer of the synthesizer ROM 50, produces a synthesized voice representing a number such as "one". Additionally, the output of monostable 46 operates a switch 52 so that the output of the synthesizer is coupled through line 53 to transformer 54 (shown in FIG. 1) and thence through capacitor 56, the closed contacts of switch 58 and the closed contacts of relay 24 to the "Ring" and "Tip" of the telephone line, whereby the caller hears the synthesized voice saying the number "one".

It should be noted from the above that there is an audio path established between "Tip" and "Ring" and line 53 which can operate in either direction. In this manner, when the pulse from the monostable 46 concludes, switch 52 connects line 53 through amplifier 60 to an automatic gain control unit 62 and through threshhold detector 64, so that if the caller makes a noise it will be amplified and operate threshhold detector 64. Counter 66 is now in a reset condition so that line 38 is at logical 0 and switch 68 connects the output of threshhold detector 64 to the clock input of data register 70. The remaining outputs of counter 44 digitally represent the number which was spoken and are coupled to the data input of data register 70 through line 72.

In the above manner, if a sound is made by a caller which operates threshhold detector 64, data register 70 will store the data representation from counter 44. If the caller does not make any sound, no data will be entered into the data register 70. In either case, when the next clock pulse occurs, counter 44 will increase its count by one for the data line and again trigger monostable 46, thereby again causing the synthesizer to speak a number, such as "two", which is the next number in the sequence. If the caller again makes a sound, the threshhold detector 64 will cause the data output of counter 44 to be entered into the data register 70. Counter 66 counts the number of pulses produced by threshhold detector 64.

At such time as counter 66 has counted three pulses, gate 74 will produce a positive output, inhibiting gate 36 via line 38 so that no more clock pulses can enter counter 44. Also line 38 moves the switch 68 so that the data register clock is now operated by gate 76. In this manner, clock pulses are used instead of pulses from the threshhold detector 64 and these are passed through gate 76 to line 78, thence through switch 68 to the clock input of data register 70. The clock pulses on line 78 are also counted by counter 80, until counter 80 has counted for three clock pulses, at which time gate 82 produces a logical 1 output resetting counter 66 which returns the circuitry of FIG. 2 to its initial conditions.

Figure 3:
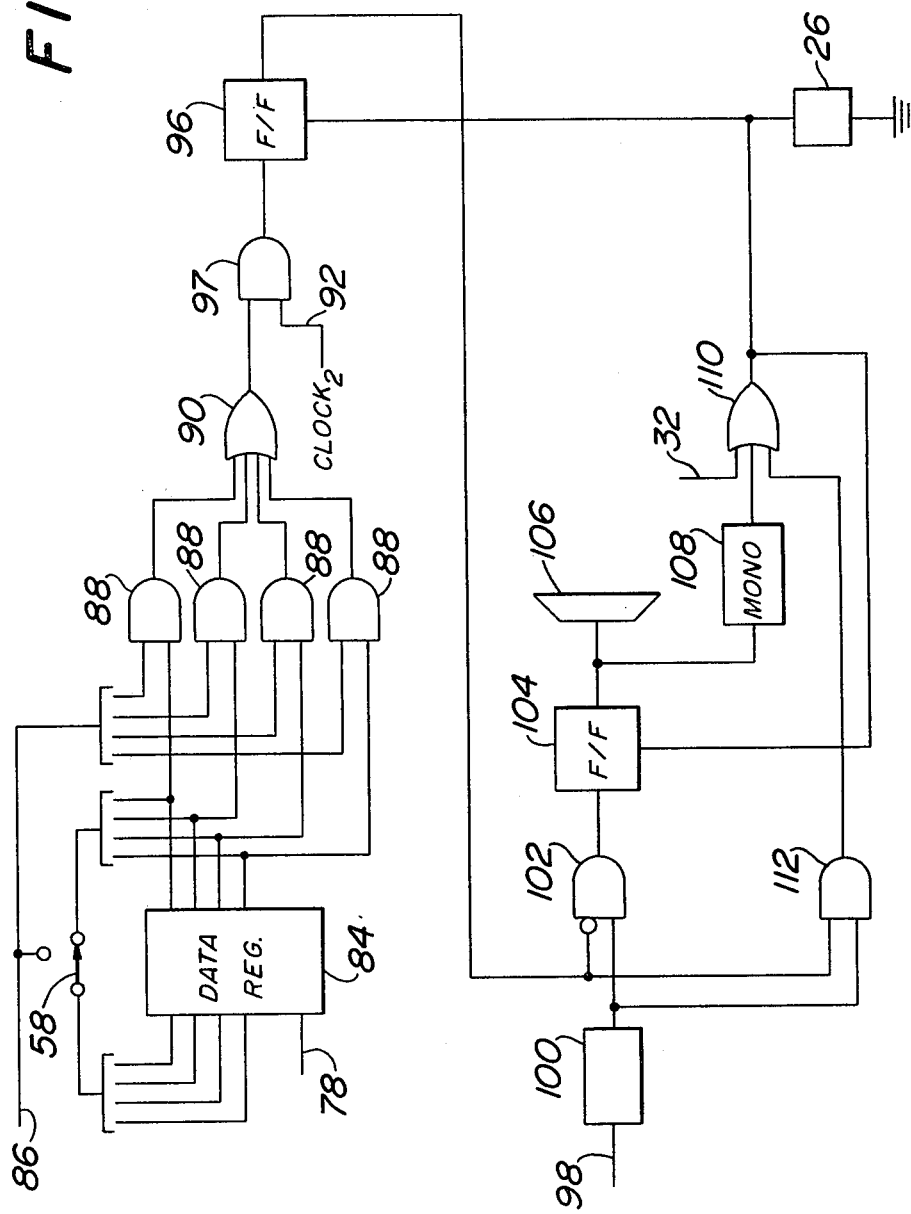
FIG. 3 is a schematic view of the logic containing the annunciator or ringer circuit with the switch in the ON position.

If switch 58 is in the ON position, as shown in FIG. 3, the pulses on line 78 are passed to data register 84. As the pulses appear at the clock input of data register 84, previously stored digits appear at the output of data register 84 and are recirculated through switch 58, so that after three pulses presented to the clock input of data register 84, the data register 84 contains the same data in the same order as previous to the pulses. However, simultaneously, the data stored in data register 70 is clocked out on line 86 so that the outputs of data registers 70 and 84 may be compared by AND-gates 88, which are combined by OR-gate 90 such that if there is any discrepancy between the outputs of the two data registers, the output of gate 90 will assume a logical 1. Clock pulses which pass through line 92 are interspersed to occur during, but not overlapping, the beginning and end of the regular clock pulses such as those which appear at 94 on line 78. Therefore, if there is a discrepancy causing a logical 1 at the output of gate 90, the clock pulses through line 92 will cause the output of gate 90 to become positive setting flip-flop 96 through gate 97. If no such discrepant pulses or comparisons occur, the flip-flop 96 will not be set, so that the output of flip-flop 96 will be logical 0 when the output of gate 90 line 96 becomes a logical 1 as a result of counter 80 counting to three. Line 98, becoming a logical 1, triggers monostable 100. If flip-flop 96 has not been set, then when monostable 100 becomes a logical 1 at its output, gate 102 will become a logical 1 at its output, setting flip-flop 104. The output of flip-flop 104 actuates an annunciator 106, of a standard type, so as to produce a ringing signal. Additionally, flip-flop 104 triggers a monostable 108, the duration of which determines how long the annunciator will operate. When monostable 108 produces a delayed output which is passed through gate 110, relay 26 is operated, which, as noted earlier, caused relay 24 to be released, returning the system of FIG. 1 to its original state. Additionally, the output of gate 110 resets flip-flop 96 putting it in its original state and also resets flip-flop 104 deactivating the annunciator.

If, when line 98 becomes a logical 1, flip-flop 96 has been set, then gate 102 is inhibited from setting flip-flop 104 and, instead, the gate is operated to produce a logical 1 to gate 112 so that relay 26 is immediately operated, releasing relay 24 and resetting flip-flops 96 and 104.

Additionally, whenever a sound following a digit causes threshhold detector 64 to operate, the output of threshhold detector 64 operates oscillator 14 to produce a sound into line 53 which is thereby returned to the caller to indicate that his sound has been detected.

Figure 4:
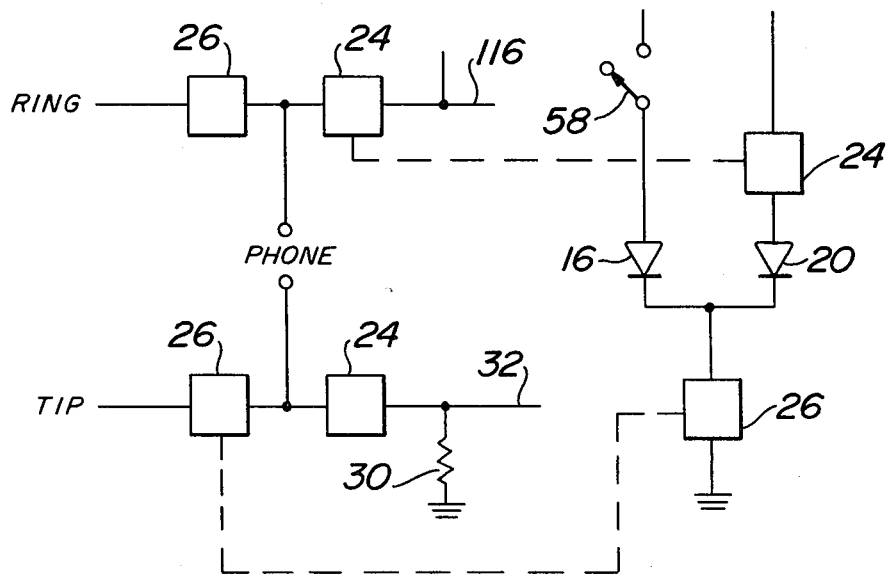
FIG. 4 is a schematic view of the phone circuit.

If, during the time that the annunciator is producing a sound because flip-flop 104 has been set, the telephone instrument shown connected in FIG. 4 goes on-hook, lines 116 and 32 will be connected so that 32 becomes a logical 1. Line 32 is also connected to gate 110 which operates relay 26 and resets flip-flop 96 and 104, returning all devices to their original state, including releasing relay 26 so that the phone instrument is connected to "Tip" and "Ring".

To enter the original number which is to be compared into data register 84, switch 58 is moved to the opposite position from that shown. The contacts of the switch connect transformer 54 in series with capacitor 56 to lines 32 and 116. Operation of the switch operates relay 26 so that the phone instrument is connected to lines 32 and 116. The phone instrument is energized by a source of voltage connected to line 116 but the current caused to flow through the phone by the voltage is limited by resistor 30. In this manner, audio is connected in either direction between the phone instrument, via lines 32 and 116, capacitor 56 and transformer 54, to line 53. Additionally, in FIG. 3, switch 58 connects the output of data register 70 to the input of data register 84. Digits are stored in data register 70 by the method described above, using counter 44, the synthesizer 50, threshhold detector 64, and the various appurtenances as described above. However, when counter 66 counts to three, causing line 38 on the output of gate 74 to become a logical 1 and activating clock pulses on line 78 via gate 76, the clock pulses transfer the contents of data register 70 into data register 84. In this manner, a number is stored in data register 84 for later comparison with a new number in data register 70 when switch 58 is in the position shown in the various figures. Data register 84 can be duplicated several times so that there can be more than one number stored for comparison.

The invention has been described above utilizing voice signals; however, any such sound is sufficient. In fact, the sound need not even be acoustical but may be electrical representations. The term "sound", therefore, as used herein and in the claims is used in the broad connotation. Also, although the term "digits" is used, it may be any type of symbol that is feasible.

As will be noted from the above description, this system, unlike the ordinary tone system, provides for an interaction between the caller and the receiver whereby there is a feedback arrangement. The only actions necessary are the generation of the sounds in the form of digits or other symbols at the receiving end and the responsive or answering digits or other symbols at the calling end. This makes the system entirely independent of touch buttons or dials. In fact, it makes it possible to eliminate the use of these buttons or dials not only on the calling and receiving instruments themselves but even at the exchange stations where not even an operator would be necessary because the voice or other sound at the calling end would trigger the system directly just as in the case of touch buttons or dials. The savings in complexity and cost of not only the instruments but of the entire system are apparent.

Decoding may take the route of going through the digits "1" through "9" once (referred to as "single pass decoding") after which the decoder would determine the intended code. For example, usable codes would be any single digit "1" through "9", but could also include various two digit, three digit, four digit codes, etc. The only restriction would be that lower numbers would have to precede higher numbers and no number could be repeated; there would be no such code as, say, "554"). Accordingly, there could only be one possible nine digit code—"123456789". There are 255 possible one, two, three, and four digit codes using the single pass decoding method, but there could be more, of course, if five, six, seven, eight, and nine digit codes were included in the decoding system.

Decoding may also take the route of going through the digits "1" through "9" or "0" through "9" any number of times (x pass decoding), but on each passing only one number would be decoded. Therefore, if the code were a three digit number—for example, "356"—"triple pass decoding" would be used: On the first passing of "0" through "9" the caller would only respond with an audio response to number "3" and remain silent following the annunciation of the other numbers. The same procedure would be followed for numbers "5" and "6" on the second and third passing. Under this method, it is possible to have any combination of digits—that is, they may repeat or follow in any order. In effect, if triple pass decoding were used to recognize a three digit number, the first passing would be for recognizing the hundred place value, the second passing for the tens place value and the third passing for the ones place value.

In any of the possible methods of decoding, the numbers utilized do not necessarily have to consist of all nine digits (or ten digits if "0" is included). For example only four digits may be used such as "1", "2", "3" and "4" and, therefore, any combination thereof. Utilized in "single pass decoding" there are 15 possible codes. If the place value method of decoding were utilized, as in, for example, "triple pass decoding", the digits 1,2,3, and 4 could be utilized in any order—only no number higher than 444 could be used and any code with a digit higher than a "4" would be restricted.

Ultimately, there are advantages and disadvantages to using either decoding method. In "single pass decoding" less time is required for decoding but coding possibilities are somewhat limited. Using double, triple, or even quadruple pass decoding would naturally take more time but coding possibilities would be greatly expanded.

In summary, when a digit is accepted by the decoder, it could let the caller know said digit was received via an acceptance signal such as a beep, a tone, or the annunciation of the same digit, etc.

After the last digit of a code is accepted by the decoder, provision can be made to have the decoder annunciate back to the caller the entire code received. If a three digit code were used, for example "356", after the caller responded to the annunciation of the digit "6" and it was accepted by the decoder, it would then annunciate back to the caller "356".

The actual operation of the decoder does not necessarily have to be limited to either "single pass decoding" or "multipass decoding" but can be a combination of both. It could, for example, be set up as a "triple pass decoder" but more than one, if not all, digits may be decoded on one pass. For example, if the three digit code were "241"—the caller could respond after the annunciation of "2" and "4" on the first pass—and then respond to "1" on the second pass (he would not be able to on the first pass obviously). The caller could have the option, however, of waiting until the third pass to respond to "1"; such might be the case if the decoder did not "hear" or, in essence, "accept" the caller's response.

What is claimed is:

1. A function-generating system comprising a receiver station, means at said receiver station to receive a transmitted signal from a sending station and to convert said transmitted signal into an initiating signal which generates an acknowledging sound signal at said receiver station, means to transmit said acknowledging sound signal to said sending station, a memory at said receiver station, means to program said memory in accordance with a predetermined enunciated sound pattern, means to transmit an enunciated sound pattern from said sending station to said memory in response to said acknowledging sound signal, and means to generate a function in response to a signal from said memory when the enunciated sound pattern from said sending station corresponds to the enunciated sound pattern programmed into said memory, said acknowledging sound signal including a series of successive sounds and said enunciated sound pattern from said sending station comprising a series of corresponding successive sounds, each of said corresponding successive sounds successively following the respective successive sounds of said acknowledging sound signal.

2. The system of claim 1 wherein said system comprises a radio telephone network wherein said receiving and sending stations are telephones having indicating means to indicate a call thereto, the generated function being the actuation of said indicating means.

3. The system of claim 2 wherein said indicating means is a telephone bell.

4. The system of claim 1 wherein the enunciated sound patterns programmed into the memory and transmitted by the sending station are acoustical sounds.

5. The system of claim 1 wherein the enunciated sound patterns programmed into the memory and transmitted by the sending station are electrical representations.

6. The system of claim 1 wherein the enunciated sound patterns programmed into the memory and transmitted by the sending station are voice representations.

7. The system of claim 1 wherein said successive sounds of said acknowledging sound signal and of said sound pattern from the sending station are sound-enunciated digits.

8. The system of claim 1 wherein said memory contains a plurality of enunciated sound patterns.

9. The system of claim 1 wherein means are provided at said receiver station to transmit a completion signal to said sending station upon reception of the completed enunciated sound pattern from said sending station.

10. The system of claim 9 wherein the completion signal comprises the transmission of the entire enunciated sound pattern from the receiving station to the sending station following the transmissions of the last of the successive sounds from the sending station.

* * * * *